US010095644B2

(12) United States Patent
Nakamuta et al.

(10) Patent No.: US 10,095,644 B2
(45) Date of Patent: Oct. 9, 2018

(54) DATA TRANSFER DEVICE AND WIRELESS COMMUNICATION CIRCUIT (71) Applicant: Murata Manufacturing Co., Ltd., Kyoto (JP)

(72) Inventors: Kazuhiro Nakamuta, Kyoto (JP); Yuji Shintomi, Kyoto (JP); Satoshi Matsumura, Kyoto (JP); Masanori Iijima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/712,465

(22) Filed: Sep. 22, 2017

(65) Prior Publication Data

US 2018/0089121 A1   Mar. 29, 2018

(30) Foreign Application Priority Data

Sep. 27, 2016 (JP) .................... 2016-188499

(51) Int. Cl.
*G06F 13/362* (2006.01)
*G06F 5/10* (2006.01)
*H03K 5/135* (2006.01)
*H03K 3/037* (2006.01)

(52) U.S. Cl.
CPC .......... *G06F 13/3625* (2013.01); *G06F 5/10* (2013.01); *H03K 5/135* (2013.01); *G06F 2205/106* (2013.01); *H03K 3/037* (2013.01)

(58) Field of Classification Search
CPC .. G06F 13/3625; G06F 13/4291; H03K 5/135
See application file for complete search history.

(56) References Cited

U.S. PATENT DOCUMENTS 5,502,689 A * 3/1996 Peterson ............... G06F 1/3203
                                                              368/156
6,166,990 A * 12/2000 Ooishi ..................... G11C 7/22
                                                              365/194
6,407,940 B1 * 6/2002 Aizawa ................. G11C 16/32
                                                              365/185.33

(Continued)

FOREIGN PATENT DOCUMENTS

JP    2008-293230 A    12/2008
JP    2008293230 A *   12/2008

(Continued)

*Primary Examiner* — Faisal M Zaman
*Assistant Examiner* — Phong H Dang
(74) *Attorney, Agent, or Firm* — Pearne & Gordon LLP (57) ABSTRACT Provided is a data transfer device that reduces generation of noise caused by an unnecessary transfer of a serial clock signal. The data transfer device includes: a clock generator circuit that generates a second serial clock signal, the second serial clock signal being synchronized with a first serial clock signal transmitted from a master device; a determination circuit that determines whether a request from the master device is addressed to the data transfer device or not; and a data processing circuit that operates by receiving a transfer of the first serial clock signal from the clock generator circuit on condition of the request from the master device being determined to be addressed to the data transfer device.

8 Claims, 9 Drawing Sheets (56) References Cited

U.S. PATENT DOCUMENTS

| | | | | |
|---|---|---|---|---|
| 2006/0174044 A1* | 8/2006 | Bomhoff | ............. | G06F 13/4286 710/110 |
| 2007/0233917 A1* | 10/2007 | Pyeon | ................. | G06F 13/4291 710/100 |
| 2008/0201588 A1* | 8/2008 | Pyeon | .................... | G11C 19/00 713/320 |
| 2014/0149805 A1* | 5/2014 | Michihata | ........... | G06F 11/0751 714/48 |
| 2016/0077990 A1* | 3/2016 | Tsujita | .................... | G06F 13/42 710/104 |

FOREIGN PATENT DOCUMENTS

| | | |
|---|---|---|
| JP | 2015-155259 A | 8/2015 |
| JP | 2016-063359 A | 4/2016 |

* cited by examiner

FIG. 10

DATA TRANSFER DEVICE AND WIRELESS COMMUNICATION CIRCUIT

This application claims priority of Japanese Patent Application No. 2016-188499 filed on Sep. 27, 2016. The content of this application is incorporated herein by reference in its entirety.

BACKGROUND

The present disclosure relates to data transfer devices and wireless communication circuits. Between a microcontroller and its peripheral devices, serial data is transmitted and received using an eight-bit data as a unit. As one of such serial data transfer techniques, for example, a bus protocol referred to as I2C bus is well known. In the I2C bus protocol, data transfer is performed using a bidirectional two-wire bus consisting of a serial clock line and a serial data line. A plurality of data transfer devices can be connected to the I2C bus. Each data transfer device functions as a master device having control authority of a data transfer or as a slave device performing a data transfer in response to a request from the master device. A serial clock signal is supplied from the master device to each of the slave devices through the serial clock line. Each slave device operates in synchronization with the serial clock signal. In the I2C bus protocol, the serial clock signal is also supplied to the slave device that does not receive a process request from the master device. In view of such matters in the background, Japanese Unexamined Patent Application Publication No. 2008-293230 proposes to stop transferring the serial clock signal from the master device to its own device when it is determined that the process request from the master device is not addressed to its own device.

BRIEF SUMMARY

In the method described in Japanese Unexamined Patent Application Publication No. 2008-293230, however, the transferring the serial clock signal from the master device to its own device continues even during the course of determining whether the process request from the master device is addressed to the data transfer device or not. Because harmonics components of the serial clock signal may sometime interfere with a radio frequency (RF) signal as noise, it is desirable not to make an unnecessary transfer of the serial clock signal as much as possible.

Thus, the present disclosure proposes a data transfer device that reduces generation of noise caused by an unnecessary transfer of a serial clock signal.

A data transfer device according to one embodiment of the present disclosure includes: (i) a clock generator circuit that generates a second serial clock signal, the second serial clock signal being synchronized with a first serial clock signal transmitted from a master device through a serial clock line; (ii) a determination circuit that operates in synchronization with the second serial clock signal and determines whether a request from the master device is addressed to the data transfer device or not; and (iii) a data processing circuit that performs a process requested by the master device, the data processing circuit receiving a transfer of the first serial clock signal from the clock generator circuit on condition of the request from the master device being determined to be addressed to the data transfer device and operating in synchronization with the first serial clock signal.

According to the present disclosure, the generation of noise caused by an unnecessary transfer of a serial clock signal can be reduced.

Other features of the present disclosure will become more apparent from the following detailed description of embodiments of the present disclosure with reference to the attached drawings.

DETAILED DESCRIPTION

Hereinafter, embodiments of the present disclosure are described with reference to the drawings. Here, the same reference numerals denote the same circuit elements, and redundant descriptions thereof are omitted. Further, for the sake of convenience of explanation, signal timing charts illustrate examples with positive logic, however, the signal timing charts may be converted for negative logic.

Figure 1:
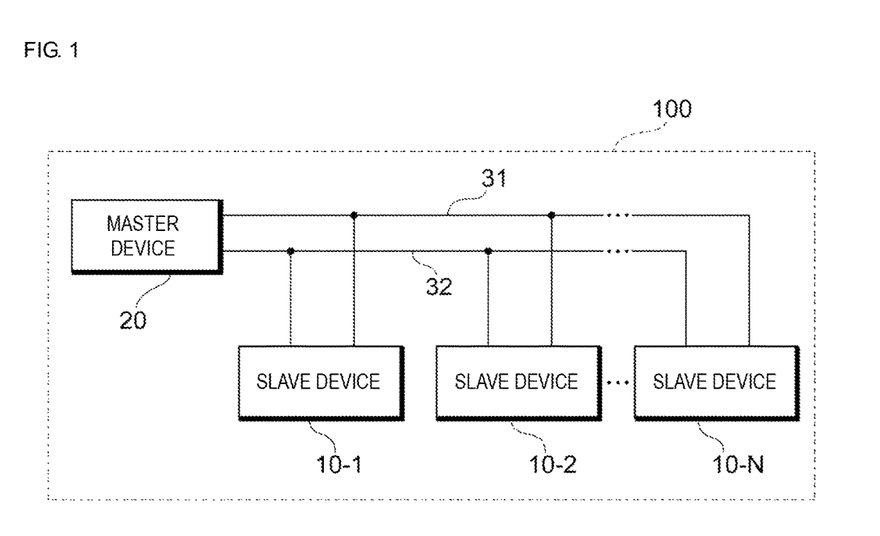
FIG. 1 is an explanatory diagram illustrating a schematic circuit configuration of a wireless communication circuit according to an embodiment of the present disclosure.

FIG. 1 is an explanatory diagram illustrating a schematic circuit configuration of a wireless communication circuit 100 according to an embodiment of the present disclosure. The wireless communication circuit 100 performs, for example, a process of transmitting and receiving a RF signal in a mobile communication terminal such as a cellular phone or the like. The wireless communication circuit 100 includes a data transfer device 20 functioning as a master device and N data transfer devices 10-1, 10-2, . . . , 10-N functioning as slave devices. Here, N is 1 or an integer greater than 1. Each of the data transfer devices 10-1, 10-2, . . . , 10-N is connected to the data transfer device 20 via a serial clock line 31 and a serial data line 32. As a bus protocol of the wireless communication circuit 100, for example, I2C bus may be used, or any other serial data transfer protocol may be used. In I2C bus protocol, it is defined that "master device" is "device that starts a data transfer, generates a serial clock signal, and ends the data transfer". Further, it is defined that "slave device" is "device to be addressed by the master device". A serial clock signal SCLK (first serial clock signal) is supplied from the master device to each slave device through the serial clock line 31. A serial data SDATA is supplied from the master device to each slave device through the serial data line 32. In the wireless communication circuit 100, for example, a baseband integrated circuit (IC) or a radio frequency integrated circuit (RFIC) can operate as the master device. Whereas, a power amplifier module, a front-end module, a switch element, and the like may operate as the slave devices.

In the present specification, "data transfer device 10" is a term collectively referring to N number of the data transfer devices 10-1, 10-2, . . . , 10-N, and the term "data transfer device 10" is used when there is no need to distinguish the data transfer devices 10-1, 10-2, . . . , 10-N.

Figure 2:
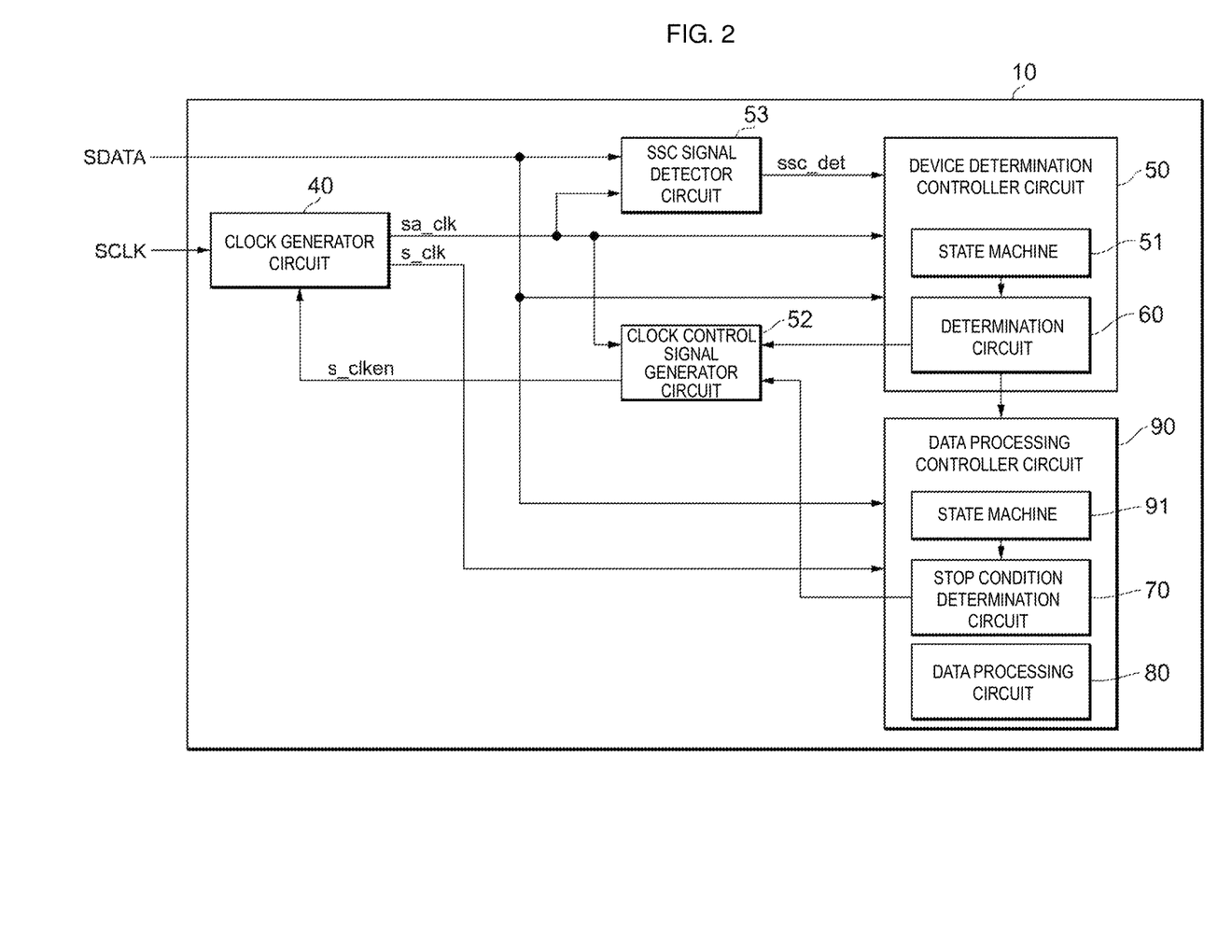
FIG. 2 is an explanatory diagram illustrating a schematic circuit configuration of a data transfer device according to an embodiment of the present disclosure.

FIG. 2 is an explanatory diagram illustrating a schematic circuit configuration of the data transfer device 10. The data transfer device 10 includes a clock generator circuit 40, a device determination controller circuit 50, a data processing controller circuit 90, a clock control signal generator circuit 52, and a SSC signal detector circuit 53. The clock generator circuit 40 generates a serial clock signal sa_clk (second serial clock signal) synchronized with the serial clock signal SCLK transmitted from the master device through the serial clock line 31. The device determination controller circuit 50 is a sequential circuit that operates in synchronization with the serial clock signal sa_clk and has a finite number of states. As long as the supply of the serial clock signal SCLK to the clock generator circuit 40 continues, the supply of the serial clock signal sa_clk to the device determination controller circuit 50 continues as well. The device determination controller circuit 50 determines a next state based on a combination of a signal inputted to the device determination controller circuit 50 and a state of the device determination controller circuit 50 at the time of the signal input. Based on that state, the device determination controller circuit 50 controls a transfer of the serial clock signal s_clk (first serial clock signal) from the clock generator circuit 40 to the data processing controller circuit 90.

The device determination controller circuit 50 includes a state machine 51 and a determination circuit 60. The state machine 51 controls a state transition. The determination circuit 60 determines whether a request from the master device is addressed to the data transfer device or not. The clock control signal generator circuit 52 controls a clock enable signal s_clken. Upon detection of the SSC signal sent from the master device through the serial data line 32, the SSC signal detector circuit 53 outputs a detection signal ssc_det to the device determination controller circuit 50. Here, the SSC signal is a signal indicating a start of communication between the master device and the slave device, and is referred to as a sequence start condition in RF front-end control interface (RFFE) bus. The device determination controller circuit 50, the clock control signal generator circuit 52, and the SSC signal detector circuit 53 operate in synchronization with the serial clock signal sa_clk. The determination circuit 60 compares an identification (ID) transmitted from the master device to address the data transfer device 10 with an ID unique to the data transfer device 10. As a result of comparison, when these IDs matches, the determination circuit 60 determines that the request from the master device is addressed to the data transfer device and outputs an ID match signal to the clock control signal generator circuit 52. On the other hand, when these IDs do not match, the determination circuit 60 determines that the request from the master device is not addressed to the data transfer device and outputs an ID mismatch signal to the clock control signal generator circuit 52. Since matching of ID is a transfer start condition of the serial clock signal s_clk from the clock generator circuit 40 to a data processing circuit 80, the determination circuit 60 may also be referred to as a start condition determination circuit. In an idle state, upon receipt of the ID match signal from the determination circuit 60, the clock control signal generator circuit 52 asserts the clock enable signal s_clken to "1". In response to the assertion of the clock enable signal s_clken to "1", the clock generator circuit 40 starts a transfer of the serial clock signal s_clk to the data processing controller circuit 90. On the other hand, in the idle state, upon receipt of the ID mismatch signal from the determination circuit 60, the clock control signal generator circuit 52 negates the clock enable signal s_clken to "0". In response to the negation of the clock enable signal s_clken to "0", the clock generator circuit 40 stops the transfer of the serial clock signal s_clk to the data processing controller circuit 90. Here, the serial clock signal s_clk may be obtained, for example, by calculating a logical conjunction between the serial clock signal SCLK and the clock enable signal s_clken.

The data processing controller circuit 90 includes a state machine 91, a stop condition determination circuit 70, and the data processing circuit 80. The state machine 91 controls a state transition. The stop condition determination circuit 70 determines whether a stop condition to stop the transfer of the serial clock signal s_clk from the clock generator circuit 40 to the data processing circuit 80 is met or not. The data processing circuit 80 performs a process requested by the master device. The process requested by the master device may be, for example, a data transfer (a transmission process of data to the master device or a reception process of data from the master device). The state machine 91, the stop condition determination circuit 70, and the data processing circuit 80 operate in synchronization with the serial clock signal s_clk. In other words, the state machine 91, the stop condition determination circuit 70, and the data processing circuit 80 operate when the request from the master device is addressed to their data transfer device.

As the stop condition, for example, six conditions listed below may be used. A first stop condition is that there is an error (for example, parity error) in data transmitted from the master device. A second stop condition is that there is an error (for example, parity error) in a command transmitted from the master device. A third stop condition is that a command transmitted from the master device is undefined. A fourth stop condition is that, without necessarily receiving a signal instructing to end the process requested by the master device, a signal instructing to start a process subsequently requested by the master device is received. A fifth stop condition is that a process requested by the master device is finished (normal end). A sixth stop condition is that the state of the device determination controller circuit 50 is the idle state. The aforementioned stop conditions are for illustrative purposes, and a condition other than the aforementioned stop conditions may also be used. When any of such stop conditions is met, the stop condition determination circuit 70 outputs, to the clock control signal generator circuit 52, a stop signal indicating that the stop condition is met. Upon receipt of the stop signal from the stop condition determination circuit 70, the clock control signal generator circuit 52 negates the clock enable signal s_clken. In response to the negation of the clock enable signal s_clken, the clock generator circuit 40 stops the transfer of the serial clock signal s_clk to the data processing circuit 80.

Figure 3:
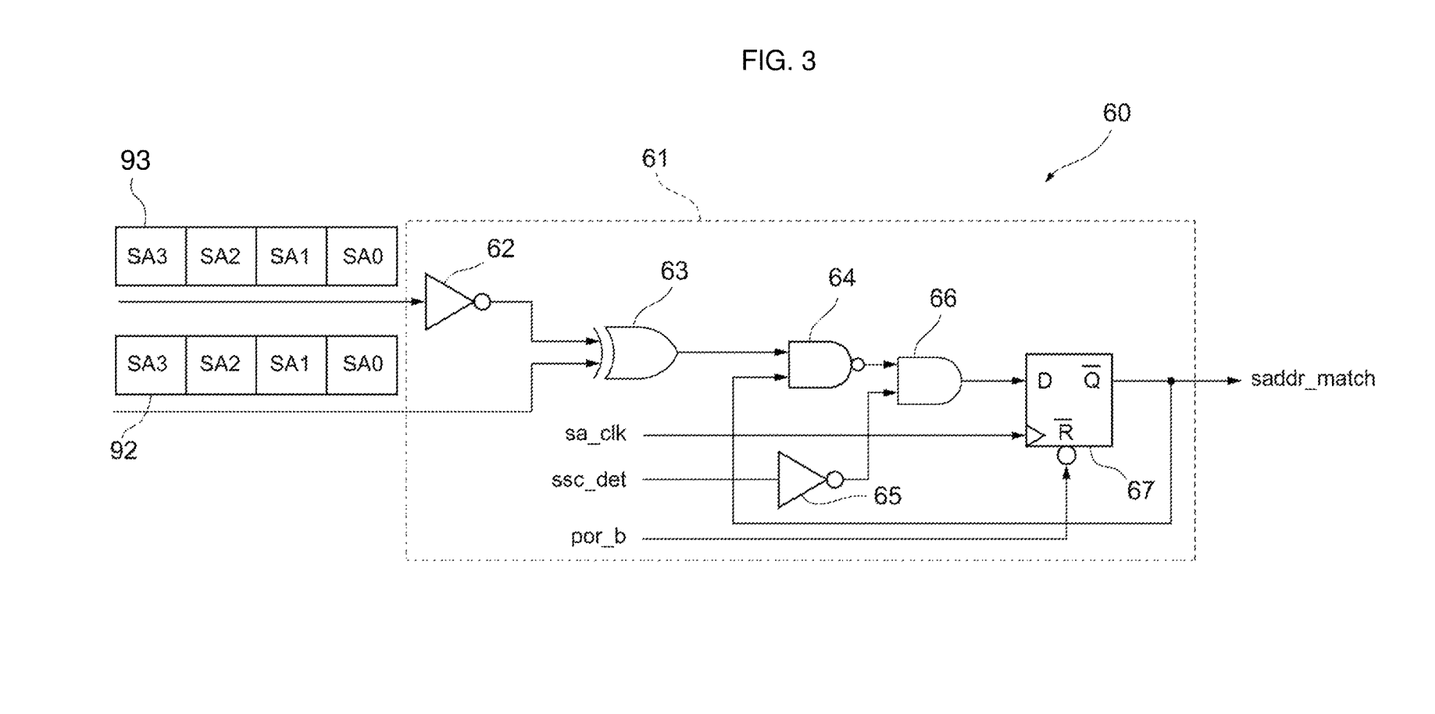
FIG. 3 is an explanatory diagram illustrating a detailed circuit configuration of a determination circuit according to an embodiment of the present disclosure.

FIG. 3 is an explanatory diagram illustrating a detailed circuit configuration of the determination circuit 60. The determination circuit 60 includes a comparison circuit 61 that compares an ID 93 transmitted from the master device to address the data transfer device 10 with an ID 92 unique to the data transfer device 10. The comparison circuit 61 outputs an ID match signal (saddr_match=1) when two IDs 92 and 93 match. Whereas, the comparison circuit 61 outputs an ID mismatch signal (saddr_match=0) when two IDs 92 and 93 do not match. The comparison circuit 61 includes a NOT gate 62, a NOR gate 63, a NAND gate 64, a NOT gate 65, a AND gate 66, and a D flip-flop 67. The NOR gate 63 receives the ID 92 and a logically-negated ID 93 obtained by the NOT gate 62. The NAND gate 64 receives an output signal of the NOR gate 63 and an output signal of the D flip-flop 67, saddr_match. The AND gate 66 receives an output signal of the NAND gate 64 and a logically-negated detection signal ssc_det obtained by the NOT gate 65. The detection signal ssc_det indicates the timing at which the SSC signal detector circuit 53 detects the SSC signal. A clock terminal of the D flip-flop 67 receives the serial clock signal sa_clk. A D terminal of the D flip-flop 67 receives an output signal of the AND gate 66. A reset terminal of the D flip-flop 67 receives a reset signal por_b. From an output terminal of the D flip-flop 67, the output signal saddr_match is outputted.

Figure 4:
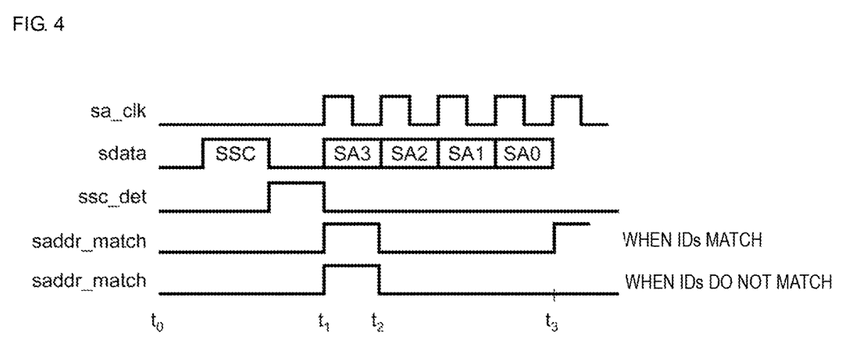
FIG. 4 is a timing chart illustrating operation of the determination circuit according to an embodiment of the present disclosure.

FIG. 4 is a timing chart illustrating the operation of the determination circuit 60. After the SSC signal is outputted from the master device, respective bit data SA3, SA2, SA1, and SA0 of the ID 93 are outputted to the serial data line 32 in this order in synchronization with the serial clock signal sa_clk. Once the SSC signal is outputted, the serial data line 32 will be in a busy state. The detection signal ssc_det changes from "0" to "1" at a falling edge of the SSC signal and changes from "1" to "0" at a raising edge of the serial clock signal sa_clk at the time of outputting the bit data SA3. The timing chart illustrated in this figure depicts a change in the logical value of the output signal saddr_match when two IDs 92 and 93 match and a change in the logical value of the output signal saddr_match when two IDs 92 and 93 do not match. The logical value of the output signal saddr_match appearing at a period between time t0 and time t1 and at a period between time t2 and time t3 may be "1" or "0".

Figure 5:
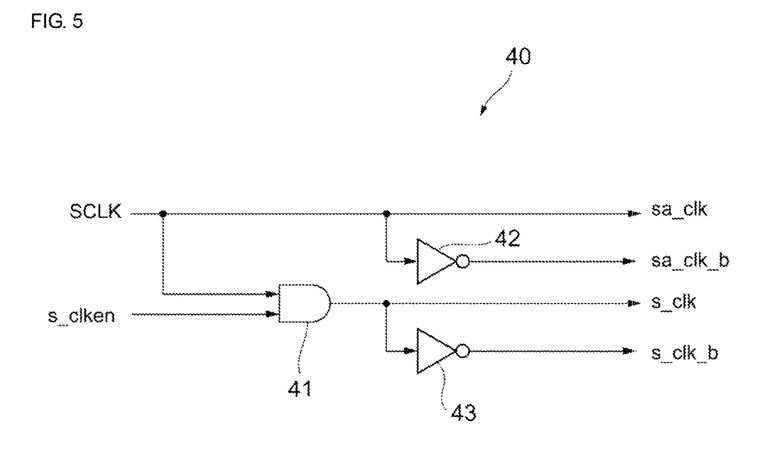
FIG. 5 is an explanatory diagram illustrating a detailed circuit configuration of a clock generator circuit according to an embodiment of the present disclosure.

FIG. 5 is an explanatory diagram illustrating a detailed circuit configuration of the clock generator circuit 40. The clock generator circuit 40 includes an AND gate 41 and NOT gates 42 and 43. The serial clock signal sa_clk generated by the clock generator circuit 40 is an in-phase signal synchronized with the serial clock signal SCLK supplied from the master device. A serial clock signal sa_clk_b is a reverse phase signal obtained by the NOT gate 42 by reversing the logical value of the serial clock signal SCLK. The serial clock signal s_clk is obtained by the AND gate 41 by calculating a logical conjunction between the serial clock signal SCLK and the clock enable signal s_clken. In other words, the serial clock signal s_clk is generated during the period in which the clock enable signal s_clken is asserted to "1". A serial clock signal s_clk_b is a reverse phase signal obtained by the NOT gate 43 by reversing the logical value of the serial clock signal s_clk.

Figure 6:
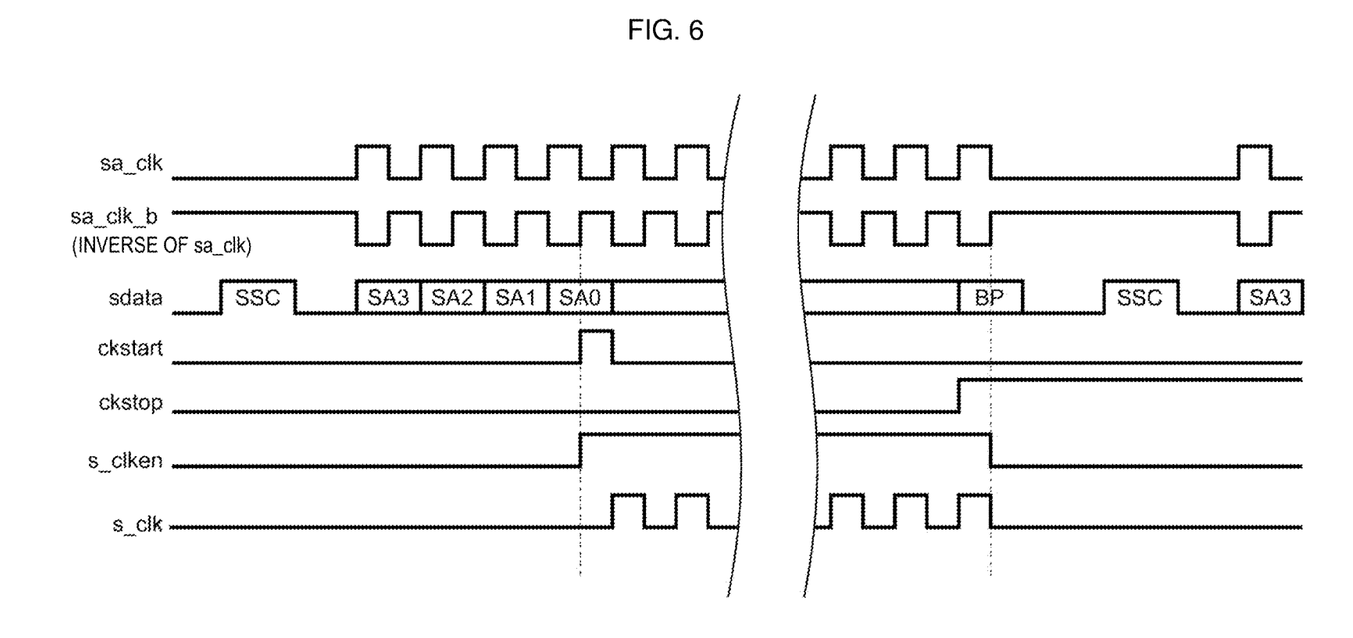
FIG. 6 is a timing chart of respective signals according to an embodiment of the present disclosure.

FIG. 6 illustrates a timing chart of respective signals in a case where the slave device ends a process without necessarily having any error in response to a request from the master device. In response to the output of saddr_match=1 from the determination circuit 60, the clock control signal generator circuit 52 changes the logical value of a process start signal ckstart from "0" to "1". Further, when the device determination controller circuit 50 detects a BP signal instructing to end a process requested by the master device, the device determination controller circuit 50 changes the logical value of a process end signal ckstop from "0" to "1". The BP signal is a signal to indicate an end of communication between the master device and the slave device, and also referred to as a bus park in the RFFE bus. In response to the change in the logical value of the process start signal ckstart from "0" to "1", the clock control signal generator circuit 52 asserts the clock enable signal s_clken to "1". Further, in response to the change in the logical value of the process end signal ckstop from "0" to "1", the clock control signal generator circuit 52 negates the clock enable signal s_clken to "0" at a rising timing of the serial clock signal sa_clk_b. During the period in which the clock enable signal s_clken is asserted to "1", the serial clock signal s_clk is transferred from the clock generator circuit 40 to the data processing circuit 80.

Figure 7:
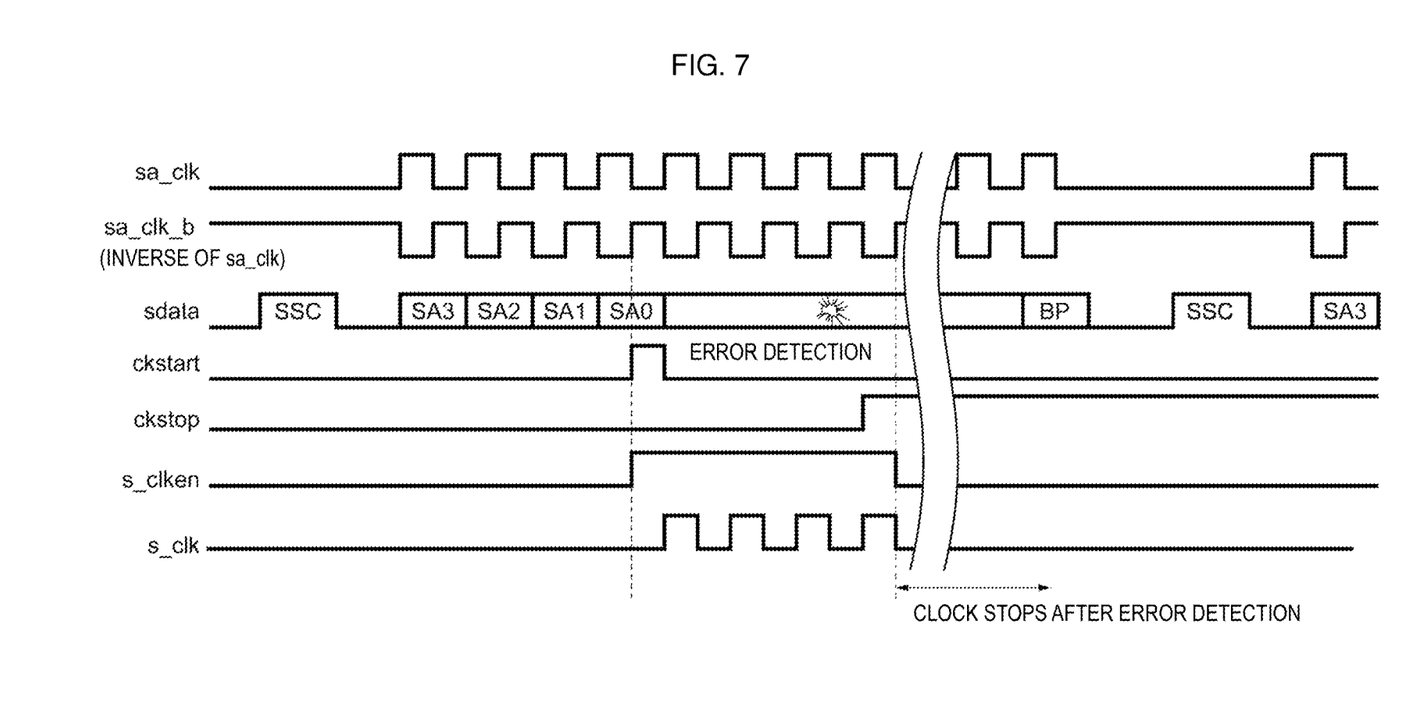
FIG. 7 is a timing chart of respective signals according to an embodiment of the present disclosure.

FIG. 7 illustrates an example of a timing chart of respective signals in a case where a requested process from the master device is ended in error without necessarily being finished by the slave device. In some case, an error such as parity error or the like is present in the serial data SDATA supplied from the master device to the slave device. When a data error is detected, the stop condition determination circuit 70 outputs, to the clock control signal generator circuit 52, the stop signal indicating that the stop condition is met. Upon receipt of the stop signal, the clock control signal generator circuit 52 negates the clock enable signal s_clken to "0" at a rising timing of the serial clock signal sa_clk_b. This enables to stop the transfer of the serial clock signal s_clk from the clock generator circuit 40 to the data processing circuit 80.

Figure 8:
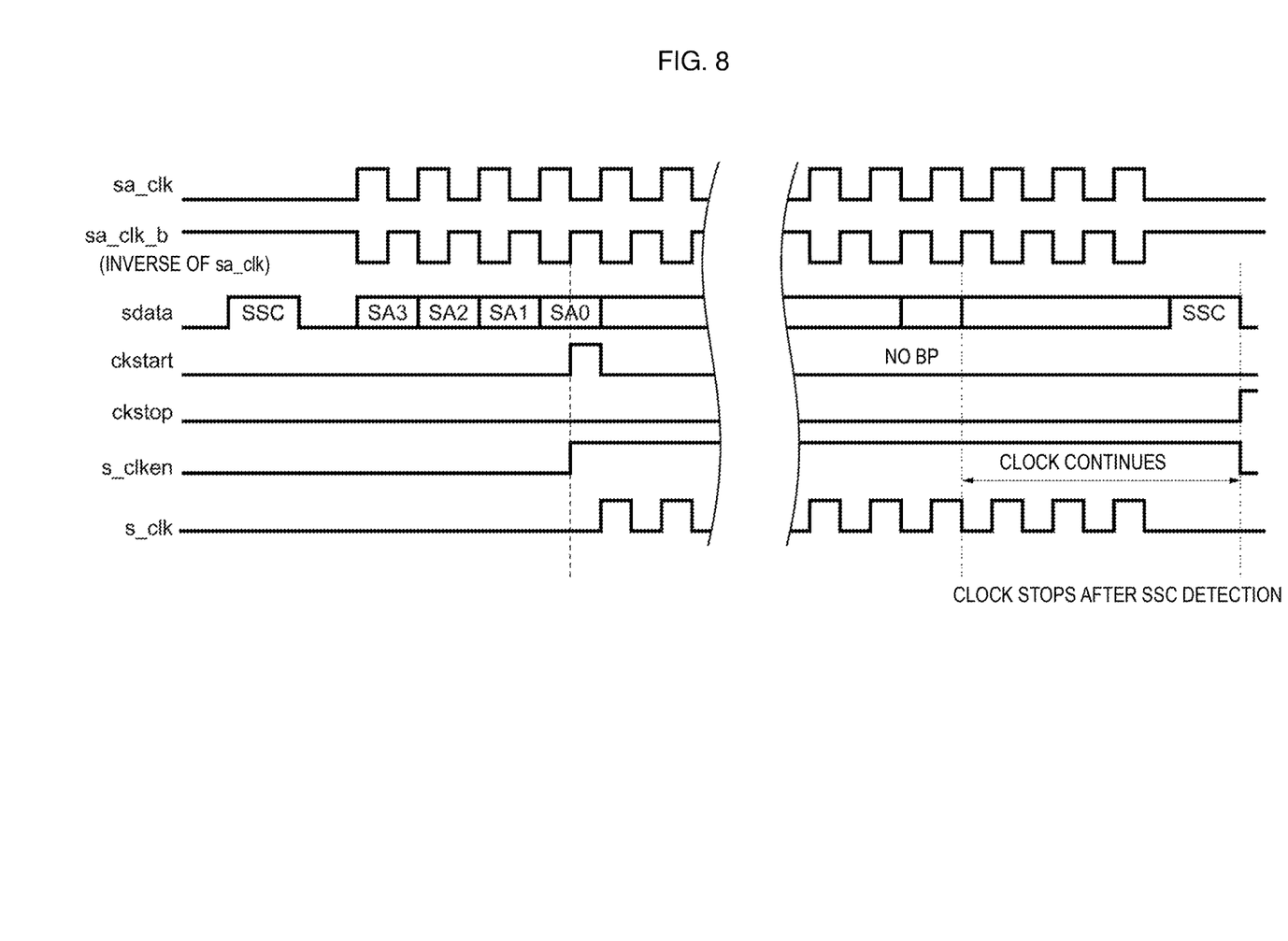
FIG. 8 is a timing chart of respective signals according to an embodiment of the present disclosure.

FIG. 8 illustrates another example of a timing chart of respective signals in a case where a requested process from the master device is ended in error without necessarily being finished by the slave device. In some case, without necessarily receiving the BP signal instructing to end the process requested by the master device, the slave device receives the SSC signal instructing to start a process subsequently requested by the master device. In such case, the clock control signal generator circuit 52 negates the clock enable signal s_clken to "0" at a falling timing of the SSC signal.

This enables to stop the transfer of the serial clock signal s_clk from the clock generator circuit 40 to the data processing circuit 80.

A timing chart of respective signals is similar to the timing chart of FIG. 7 when one of the aforementioned six stop conditions, other than the stop conditions illustrated in FIG. 7 and FIG. 8, is met, and thus illustration thereof is omitted.

Figure 9:
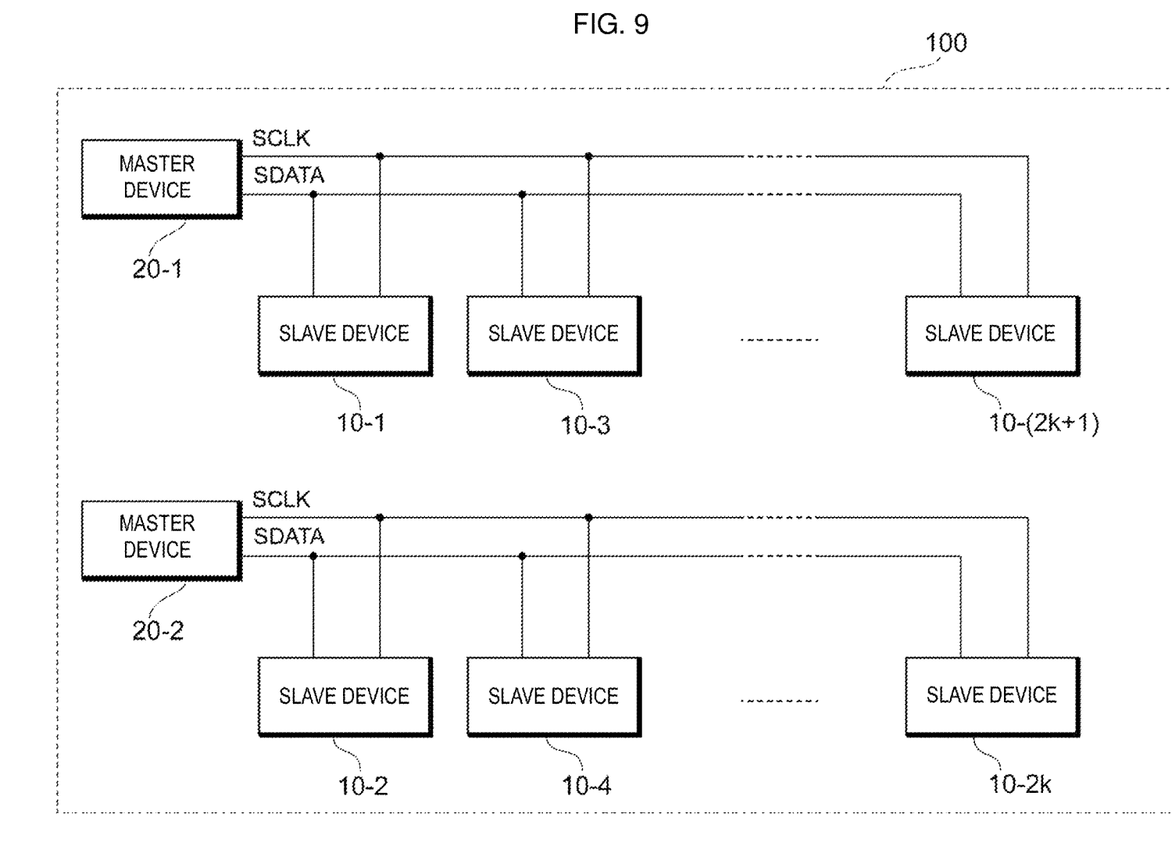
FIG. 9 is an explanatory diagram illustrating a schematic circuit configuration of a wireless communication circuit according to an embodiment of the present disclosure.
Figure 10:
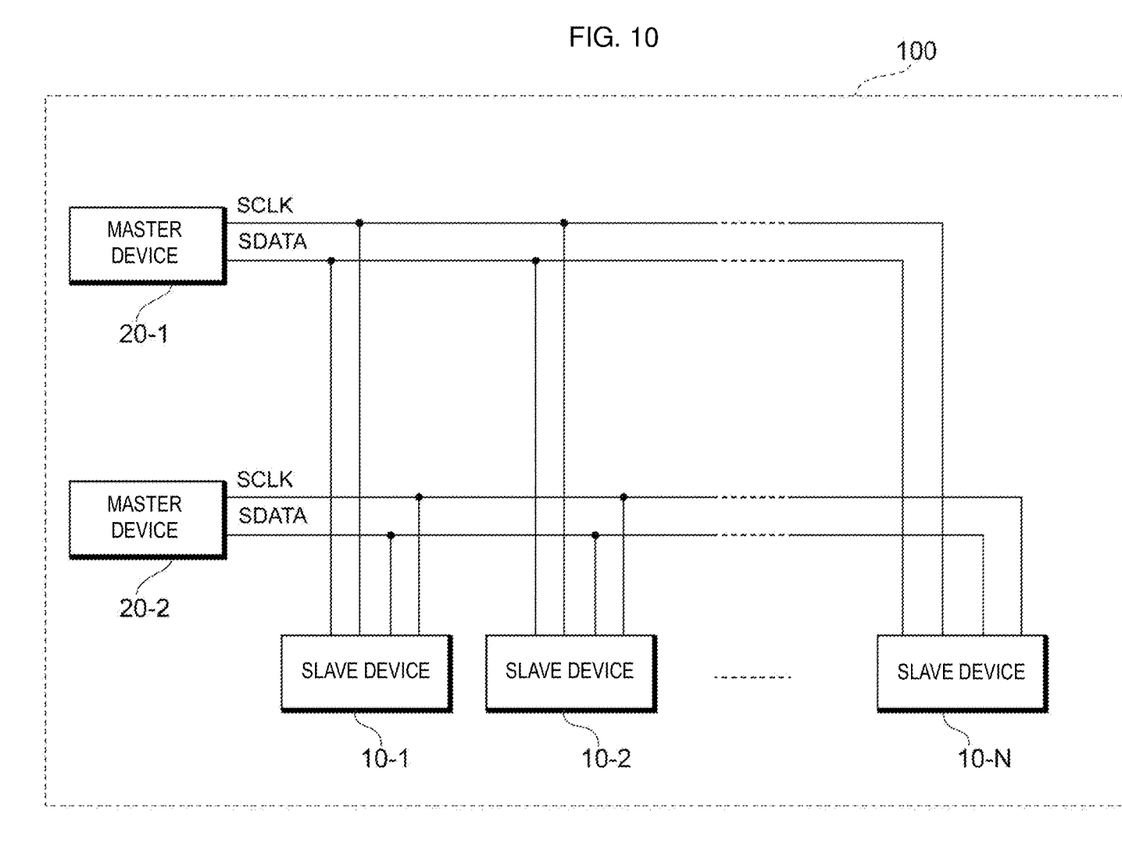
FIG. 10 is an explanatory diagram illustrating a schematic circuit configuration of a wireless communication circuit according to an embodiment of the present disclosure.

Further, a connection form of the data transfer devices 10-1, 10-2, . . . , 10-N inside the wireless communication circuit 100 is not limited to the example illustrated in FIG. 1. For example, a data transfer device 20-1 functioning as a master device and the data transfer devices 10-1, 10-3, . . . , 10-(2k+1) functioning as slave devices may be connected as illustrated in FIG. 9. Similarly, a data transfer device 20-2 functioning as a master device and the data transfer devices 10-2, 10-4, . . . , 10-(2k) functioning as slave devices may be connected. Here, it is assumed that 2k+1=N. Alternatively, each of the data transfer devices 10-1, 10-2, . . . , 10-N functioning as a slave device and a plurality of the data transfer devices 20-1, 20-2 functioning as master devices may be connected as illustrated in FIG. 10. In the configuration illustrated in FIG. 10, a bus arbitration is performed between the plurality of the data transfer device 20-1 and 20-2, and of these data transfer devices, one having a right to use the bus operates as the master device and performs a data transfer with each of the slave devices.

According to the present embodiment, the data transfer device 10 transfers the serial clock signal s_clk from the clock generator circuit 40 to the data processing circuit 80 after the data transfer device 10 determines that the request from the master device is addressed to the data transfer device. This enables to prohibit an unnecessary transfer of the serial clock signal s_clk to the data processing circuit 80 during the course of determining whether the process request from the master device is addressed to the data transfer device or not. Suppressing the unnecessary transfer of the serial clock signal s_clk to the data processing circuit 80 reduces radiation noise, and eventually contributes to reduction of power consumption.

Further, the process of the data processing circuit 80 can be properly stopped by stopping the transfer of the serial clock signal s_clk to the data processing circuit 80 when a predetermined stop condition is met. For example, by setting presence of error in data transmitted from the master device as the stop condition, it is possible to suppress an unnecessary transfer of the serial clock signal s_clk to the data processing circuit 80 after detecting an error in the data. Further, by setting presence of error in a command transmitted from the master device as the stop condition, it is possible to suppress an unnecessary transfer of the serial clock signal s_clk to the data processing circuit 80 after detecting an error in the command. Further, by setting a condition that a command transmitted from the master device is undefined as the stop condition, it is possible to suppress an unnecessary transfer of the serial clock signal s_clk to the data processing circuit 80 after detecting that the command is undefined. Further, by setting, as the stop condition, a condition that, without necessarily receiving the BP signal instructing to end a process requested by the master device, the SSC signal instructing to start a process subsequently requested by the master device is received, it is possible to suppress an unnecessary transfer of the serial clock signal s_clk to the data processing circuit 80 after receiving the SSC signal even when the BP signal is not received. As a result, the unnecessary transfer of the serial clock signal s_clk, which becomes a noise source, can be stopped.

Further, in a case where the data transfer device 10 communicates with a plurality of master devices, the number of the serial clock signals s_clk increases. Thus, prohibiting the unnecessary transfer of the serial clock signal s_clk can be made. Further, in the wireless communication circuit 100, harmonic components of the serial clock signal sometimes interfere with a RF signal as noise. Thus, prohibiting the unnecessary transfer of the serial clock signal s_clk can be made.

The embodiments described above are provided to facilitate understanding of the present invention and is not to be construed as limiting the present invention. The present invention can be modified or improved without departing from its spirit, and the present invention also includes equivalents thereof. That is, ones obtained by suitably modifying designs of the respective embodiment by those skilled in the art are also included within the scope of the present invention as long as they include features of the present invention. Each of elements included in the embodiments as well as its spatial arrangement, material, condition, shape, size, and the like are not limited to those exemplified, and may be suitably changed. For example, that "a circuit element A is connected to a circuit element B" means not only a case where the circuit element A is directly connected to the circuit element B, but also means a case where a signal path can be selectively established via a circuit element C (for example, a switch element) between the circuit element A and the circuit element B. Further, spatial relationships such as up, down, left, right, and the like are not limited to the ratios illustrated in the drawings unless otherwise specified. Further, elements included in the respective embodiments may be combined as long as technically feasible, and ones obtained by combining those are also included within the scope of the present invention as long as they include the features of the present invention.

While embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A data transfer device comprising:
   a clock generator circuit configured to generate a second serial clock signal, the second serial clock signal being synchronized with a first serial clock signal transmitted from a master device to the data transfer device through a serial clock line;
   a determination circuit configured to operate in synchronization with the second serial clock signal and determine whether a request from the master device is addressed to the data transfer device;
   a data processing circuit configured to perform a process requested by the master device, the data processing circuit receiving a transfer of the first serial clock signal from the clock generator circuit when the request from the master device is determined to be addressed to the data transfer device and the data processing circuit operating in synchronization with the first serial clock signal;
   a stop condition determination circuit configured to determine whether a stop condition is met, to generate a stop signal, and to send the stop signal to a clock control signal generator circuit; and
   the clock control signal generator circuit configured to transmit an enable signal to the clock generator circuit and to negate the enable signal when the clock control signal generator circuit receives the stop signal from the stop condition determination circuit,
   wherein the clock generator circuit is further configured to stop the transfer of the first serial clock signal to the data processing circuit when the enable signal is negated.

2. The data transfer device according to claim 1, wherein the stop condition is met when:
   there is an error in data transmitted from the master device,
   there is an error in a command transmitted from the master device,
   an undefined command is transmitted from the master device, or
   an instruction from the master device to start a new process is received without first receiving an instruction from the master device to end a previously requested process.

3. The data transfer device according to claim 1, wherein the determination circuit comprises:
   a D flip-flop that outputs a signal indicating whether the request from the master device is addressed to the data transfer device;

a first NOT gate that logically negates an identifier transmitted from the master device, the identifier indicating to which data transfer device the request is addressed;

a NOR gate that receives the logically negated identifier from the first NOT gate and an identifier unique to the data transfer device;

a NAND gate that receives an output of the NOR gate and an output of the D flip-flop;

a second NOT gate that logically negates a detection signal, the detection signal indicating a timing at which a signal indicating a start of communication between the master device and the slave device is transmitted by the master device to the data transfer device; and an AND gate that receives an output of the NAND gate and the logically negated detection signal, wherein the D flip-flop receives the second serial clock signal and an output signal of the AND gate.

4. The data transfer device according to claim 1, wherein the data transfer device is connected to a plurality of master devices.

5. A wireless communication circuit comprising:
the data transfer device according to claim 1.

6. A wireless communication circuit comprising:
the data transfer device according to claim 3.

7. A wireless communication circuit comprising:
the data transfer device according to claim 2.

8. A data transfer device comprising:
a clock generator circuit configured to generate a second serial clock signal, the second serial clock signal being synchronized with a first serial clock signal transmitted from a master device to the data transfer device through a serial clock line;

a determination circuit configured to operate in synchronization with the second serial clock signal and determine whether a request from the master device is addressed to the data transfer device; and a data processing circuit configured to perform a process requested by the master device, the data processing circuit receiving a transfer of the first serial clock signal from the clock generator circuit when the request from the master device is determined to be addressed to the data transfer device and the data processing circuit operating in synchronization with the first serial clock signal, wherein the determination circuit comprises:
a D flip-flop that outputs a signal indicating whether the request from the master device is addressed to the data transfer device;

a first NOT gate that logically negates an identifier transmitted from the master device, the identifier indicating to which data transfer device the request is addressed;

a NOR gate that receives the logically negated identifier from the first NOT gate and an identifier unique to the data transfer device;

a NAND gate that receives an output of the NOR gate and an output of the D flip-flop;

a second NOT gate that logically negates a detection signal, the detection signal indicating a timing at which a signal indicating a start of communication between the master device and the slave device is transmitted by the master device to the data transfer device; and an AND gate that receives an output of the NAND gate and the logically negated detection signal, wherein the D flip-flop receives the second serial clock signal and an output signal of the AND gate.

* * * * *